(12) United States Patent
Chen et al.

(10) Patent No.: US 9,024,380 B2
(45) Date of Patent: May 5, 2015

(54) SEMICONDUCTOR DEVICE WITH FLOATING RESURF REGION

(75) Inventors: Weize Chen, Phoenix, AZ (US); Richard J. De Souza, Chandler, AZ (US); Patrice M. Parris, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 144 days.

(21) Appl. No.: 13/529,589

(22) Filed: Jun. 21, 2012

(65) Prior Publication Data

US 2013/0341717 A1    Dec. 26, 2013

(51) Int. Cl.
*H01L 29/66* (2006.01)
*H01L 29/06* (2006.01)
*H01L 29/78* (2006.01)

(52) U.S. Cl.
CPC ........ *H01L 29/0692* (2013.01); *H01L 29/0634* (2013.01); *H01L 29/0653* (2013.01); *H01L 29/66659* (2013.01); *H01L 29/7835* (2013.01)

(58) Field of Classification Search
CPC .................................................. H01L 29/0634
USPC ........................................................ 257/337
See application file for complete search history.

(56) References Cited

U.S. PATENT DOCUMENTS

| 6,069,396 | A  | * | 5/2000  | Funaki ............................ 257/492 |
| 7,074,681 | B2 | * | 7/2006  | de Fresart et al. ............. 438/294 |
| 8,252,652 | B2 | * | 8/2012  | Chang et al. ................... 438/286 |
| 2002/0096708 | A1 | * | 7/2002  | Ahlers et al. ................... 257/328 |
| 2008/0029814 | A1 | * | 2/2008  | Khalil ............................. 257/339 |
| 2009/0020814 | A1 | * | 1/2009  | Choi et al. ...................... 257/343 |
| 2010/0025756 | A1 | * | 2/2010  | Fu et al. .......................... 257/328 |
| 2011/0241114 | A1 | * | 10/2011 | Su et al. .......................... 257/343 |
| 2012/0126323 | A1 | * | 5/2012  | Wu et al. ......................... 257/343 |

OTHER PUBLICATIONS

H.P. Xu et al., "Superjunction LDMOS with Drift Region Charge-Balanced by Distributed Hexagon P-islands," IEEE, pp. 313-316 (2003).

* cited by examiner

*Primary Examiner* — Steven Loke
*Assistant Examiner* — Sitaramarao S Yechuri
(74) *Attorney, Agent, or Firm* — Lempia Summerfield Katz LLC

(57) ABSTRACT

A device includes a semiconductor substrate, a body region in the semiconductor substrate, having a first conductivity type, and including a channel region through which charge carriers flow, a drain region in the semiconductor substrate, having a second conductivity type, and spaced from the body region along a first lateral dimension, a drift region in the semiconductor substrate, having the second conductivity type, and electrically coupling the drain region to the channel region, and a plurality of floating reduced surface field (RESURF) regions in the semiconductor substrate adjacent the drift region, having the first conductivity type, and around which the charge carriers drift through the drift region under an electric field arising from a voltage applied to the drain region. Adjacent floating RESURF regions of the plurality of floating RESURF regions are spaced from one another along a second lateral dimension of the device by a respective gap.

14 Claims, 4 Drawing Sheets

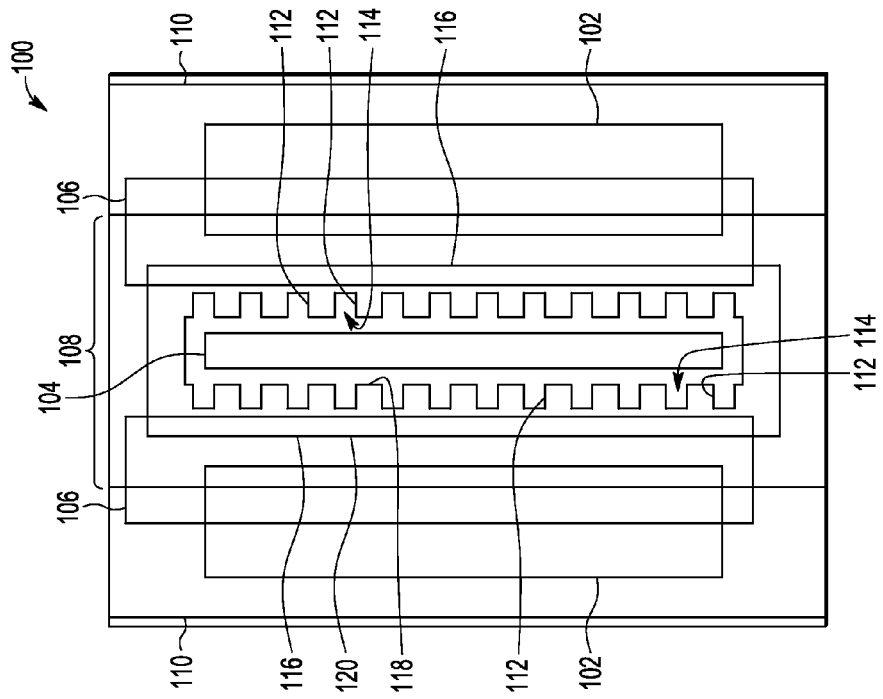
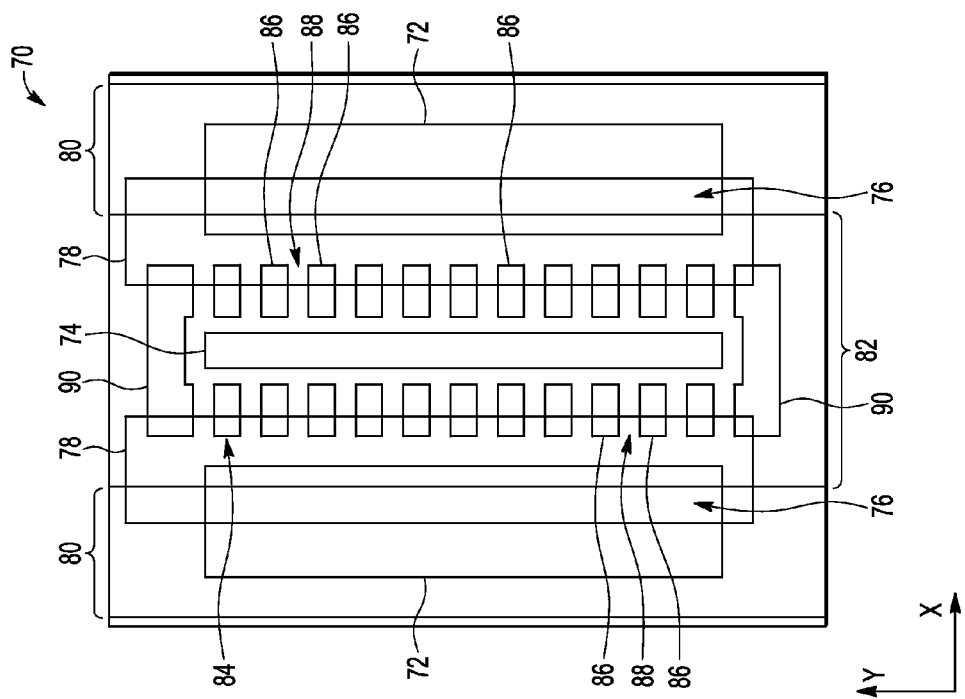
FIG. 3
FIG. 2

SEMICONDUCTOR DEVICE WITH FLOATING RESURF REGION

FIELD OF INVENTION

The present embodiments relate to semiconductor devices.

BACKGROUND

Integrated circuits (ICs) and other electronic devices often include arrangements of interconnected field effect transistors (FETs), also called metal-oxide-semiconductor field effect transistors (MOSFETs), or simply MOS transistors or devices. A typical MOS transistor includes a gate electrode as a control electrode and spaced apart source and drain electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor is a laterally diffused metal-oxide-semiconductor (LDMOS) transistor. In an LDMOS device, a drift space is provided between the channel region and the drain region.

LDMOS devices may be designed to operate in a high-side configuration in which all of the device terminals are level shifted with respect to the substrate potential. Devices configured for high-side operation have been applied in power switchers in DC-to-DC converters, which have respective LDMOS devices for the high side and low side. High-side capable devices may be designed to prevent a direct punch-through path from a body region of the LDMOS device to an underlying substrate.

LDMOS devices are often used in applications, such as automotive applications, involving operational voltages greater than 40 volts. Breakdown resulting from applying such high voltages to the drain is often prevented through a reduced surface field (RESURF) structure in the LDMOS device design. The RESURF structure is designed to deplete the drift space of the LDMOS device in both vertical and lateral directions, thereby reducing the electric field near the surface at the drift region and thus raising the off-state breakdown voltage (BVdss) of the device.

Typically a trade-off exists between BVdss and drain-source ON-resistance (Rdson). BVdss determines the achievable output voltage rating for the device. Rdson determines the device area required to handle a given amount of current, e.g., the current or power rating of the device. Designing a device to achieve a higher BVdss level (and therefore higher operating voltage) is often at the cost of increased Rdson (and thus lower current rating per unit area). For example, the BVdss level may be increased by increasing the length of the drift space of the device or reducing the dopant concentration in the drift space, both of which increase Rdson. Conversely, designing a device to reduce Rdson (and thus increase the current rating per unit area) leads to lower BVdss levels (and thus lower operating voltage). For example, a higher dopant concentration in the drift space lowers Rdson at the expense of a lower BVdss. Other Rdson reduction techniques involve increasing device area and, thus, the manufacturing cost of the device.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

FIG. 2 is a plan view of an exemplary field drift LDMOS transistor having a drift region with a plurality of spaced apart, floating RESURF islands in accordance with one embodiment.

FIG. 3 is a plan view of an exemplary field drift LDMOS transistor having a drift region with a plurality of spaced apart, floating RESURF regions connected in a comb-shaped or notched arrangement in accordance with another embodiment.

DETAILED DESCRIPTION OF THE PRESENTLY PREFERRED EMBODIMENTS

Figure 1:
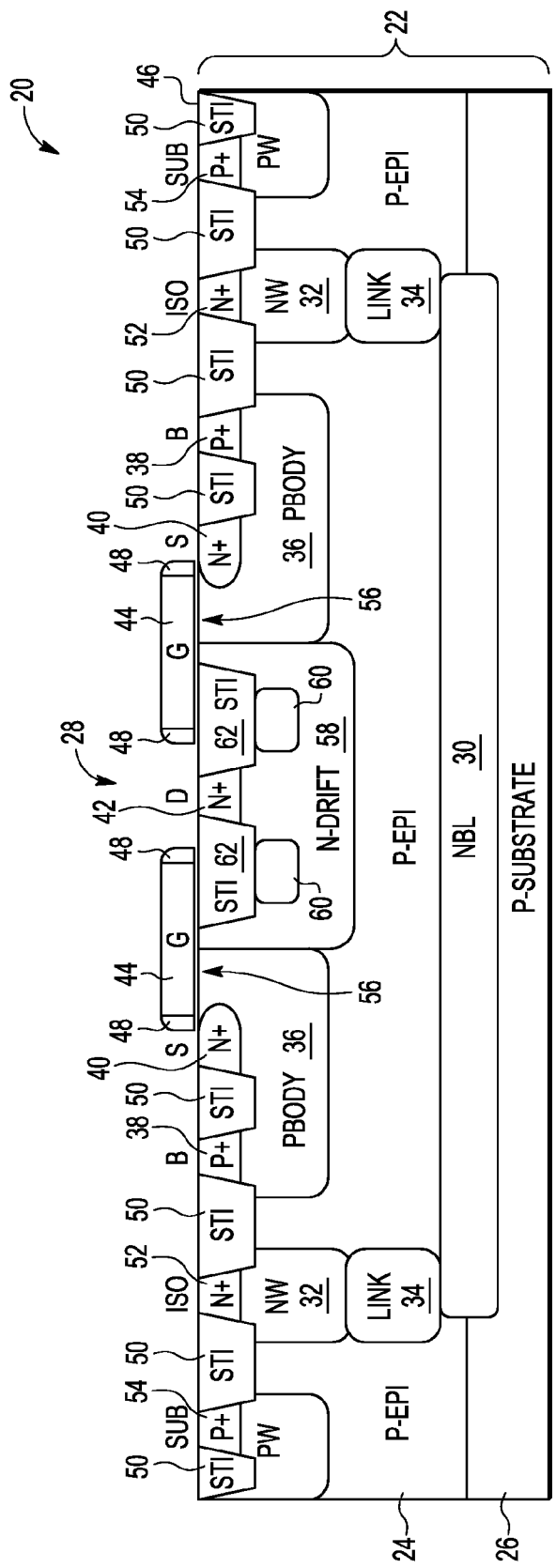
FIG. 1 is a cross-sectional, schematic view of an exemplary field drift LDMOS transistor with a drift region having a plurality of spaced apart, floating RESURF regions configured in accordance with one embodiment.

Laterally diffused metal oxide semiconductor (LDMOS) and other power transistor devices and electronic apparatus are described. The devices and electronic apparatus may have a drift region configured with at least one set of spaced apart, floating regions. The regions may be disconnected from one another (e.g., as islands) or connected in, for instance, a comb-shaped arrangement or notched configuration. The regions provide a multi-dimensional RESURF effect (e.g., lateral and vertical) to improve the BVdss of the disclosed devices. The benefit of the RESURF effect is achieved, however, with additional design flexibility in the trade-off between the off-state breakdown voltage level (BVdss) and the on-state resistance value (Rdson). The BVdss and Rdson values may thus be tuned or customized for a specific device or application. The customization may be provided without changing or adding fabrication process steps. For example, the regions may be formed using an existing well implant and/or other fabrication process already used in the fabrication process flow.

An optimum balance between BVdss and Rdson may be attained by adjusting the width of the regions and/or the spacing between the regions. The width and the spacing provide additional variables, or degrees of freedom, to be manipulated during the design of devices configured in accordance with the disclosure. Such additional design flexibility may allow other electrical characteristics of the disclosed devices to be optimized or adjusted. For example, hot carriers generated by impact ionization may be minimized without sacrificing BVdss or Rdson through overall design optimization.

The spaced apart nature of the floating regions may present a discontinuous or non-uniform (e.g., notched) interface within the drift region for the charge carriers. In some embodiments, the discontinuities or non-uniformities of the interface are disposed on a side facing a central drain region of the device (e.g., the drain-side face). The opposite side of the interface, e.g., a channel-facing side, may be configured differently. For example, the floating regions may be connected on one side (e.g., the channel-facing side) to form a continuous (e.g., uniform or straight) side or face. In such cases, the drain-facing side may include notches to form the discontinuities or non-uniformities. Together, the two sides may be configured to present a comb-shaped structure.

The difference between the two sides may increase breakdown protection by obstructing or discouraging charge carrier movement in the off state, but less so in the ON state. For example, in the OFF state, when the voltage across the drift region is high, and the RESURF effect depletion is greatest, the continuous (or non-notched) side facing the channel provides a significant barrier to breakdown-related charge carrier movement toward the drain. In contrast, when the device is in the ON state, the voltage across the drift region may be much lower, in which case the notches or other discontinuities in the interface reduce or minimize the barrier presented by the floating regions in the drift region.

In non-island embodiments, one or both sides of the floating region may have non-uniformities. The non-uniformities of the floating region may face the body region of the device in addition to, or instead of, the drain region. With some gap sizes, the floating region and the body region (e.g., p-type regions) together may deplete the oppositely doped regions (e.g., n-type regions) in between or adjacent such regions, preventing the high electric potential from reaching up to the semiconductor substrate surface in the accumulation region. In such cases, configuring the floating region with a uniform side that faces the body region may be useful. In other embodiments, such as those having a double or multiple finger gate configuration, the floating regions in the drift regions of adjacent gate fingers (that share one drain region) may have a similar effect and prevent the high potential at the drain region contact from extending through the drift region. In such cases, a floating region having a uniform side facing the drain region may be useful. The shape of the floating regions may thus depend on one or more aspects of the device configuration.

Although described below in connection with embodiments having a single ring of floating regions surrounding the drain region, several other embodiments are possible. For example, multiple rings of islands (or multiple comb-shaped or other rings) may be disposed adjacent the drift region. The discontinuities of the rings (e.g., islands or notches) may be aligned or staggered within the drift region. The shape of the islands or notches may vary from the examples shown. For example, the islands or notches may have a trapezoidal, oval, circular, or other polygonal cross-sectional shape rather than the rectangular shapes shown. The floating RESURF islands or other regions may also extend to and/or reach the surface of the semiconductor substrate (e.g., alongside an isolation trench at a position adjacent an accumulation region of the device).

Although described below in connection with n-channel LDMOS transistors, the disclosed devices are not limited to any particular transistor configuration. For instance, application of the features of the disclosed devices is not limited to LDMOS or other power MOS devices. One or more features of the disclosed devices may be applied to other device configurations, including, for instance, bipolar transistors. The floating regions of the disclosed devices may be useful in a wide variety of power electronic devices. The floating regions are also not limited to any one particular type of RESURF configuration. The disclosed devices may have varying RESURF structures, including single, double, or other RESURF structural arrangements, each of which may be referred to herein as a "RESURF transistor."

For convenience of description and without any intended limitation, n-channel LDMOS devices are described and illustrated herein. Thus, p-type islands or other regions are described for an n-type drift region. However, the disclosed devices are not limited to n-channel devices, as p-channel and other types of devices may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below.

FIG. 1 is a schematic cross-sectional view of an example of an n-channel field LDMOS device 20 constructed in accordance with one embodiment. The device 20 may be configured as a RESURF transistor. The device 20 includes a semiconductor substrate 22, which may, in turn, include a number of epitaxial layers 24. In this example, the semiconductor substrate 22 includes a single p-type epitaxial layer P-EPI grown on an original substrate 26. The original substrate 26 may be a heavily doped p-type substrate in some cases, such as those having multiple epitaxial layers. The device 20 may alternatively or additionally include non-epitaxial layers in which one or more device regions are formed. Any one or more of the layers of the semiconductor substrate 22 may include silicon. The structural, material, and other characteristics of the semiconductor substrate 22 may vary from the example shown. For example, the semiconductor substrate 22 may include a silicon-on-insulator (SOI) construction. Additional, fewer, or alternative layers may be included in the semiconductor substrate 22. For example, any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

An active area 28 of the device 20 is depicted in FIG. 1. The active area 28 is defined by one or more doped isolating layers or regions in the semiconductor substrate 22 (e.g., the epitaxial layer 24). The doped isolating layer(s) or region(s) may laterally and/or otherwise surround the active area 28. These layers or regions act as a barrier or isolation layer separating the active area 28 from the rest of the substrate 22 (or the original substrate 26). In this example, an N-type buried layer (NBL) 30 is formed or disposed in the semiconductor substrate 22, which may be formed in the epitaxial layer 24 thereof. The NBL 30 extends across (e.g., under) the active area 28 of the device 20 to act as a barrier or isolation layer separating the active area 28 from the original substrate 26. The NBL 30 may constitute one of several doped isolating regions surrounding the active area 28 of the device 20.

The example depicted in FIG. 1 also includes a moderately or heavily doped n-type isolation well 32 laterally surrounding the active area 28. The isolation well 32 may be ring-shaped. The isolation well 32 may be disposed on or otherwise above the NBL 28 and outside of, or along, the lateral periphery of the active area 28 as shown. The isolation well 32 may be formed in conjunction with one or more n-type wells, such as an n-type drift region described below. The isolation well 32 may be connected to the NBL 30 via one or more link regions 34. The link regions 34 may be formed via an implantation procedure apart from those used to form the isolation well 32 and the NBL 30. The implantation procedure may be an existing (i.e., available) implantation procedure configured to form a component of another device. The existing implantation procedure may thus provide a convenient technique for linking the isolation well 32 and the NBL 30. With such linking, the NBL 30, the isolation well 32, and the link region 34 may thus be biased at the same voltage.

In this example, the link region 34 is also configured as a ring. In alternative embodiments, the isolation well 32 is configured as a sink that connects to the NBL 30 directly. One or more of the above-described isolating regions may have a dopant concentration level and/or be otherwise configured for high voltage (HV) operation (e.g., high side operation in which the terminals of the device 20 are level shifted relative to the semiconductor substrate 22, which is typically grounded), including punch-through prevention. Any number of the isolation wells, sinks, or buried layers may be connected to one another. Additional, fewer, or alternative isolation layers or regions may be provided in the semiconductor substrate 22.

The device 20 includes a device body or body region 36 in the semiconductor substrate 22. In this example, the body region 36 is a p-type well formed in the epitaxial layer 24 of the substrate 22. The p-type well may be configured for high voltage operation (e.g., high side operation). The body region 36 may be biased via one or more heavily doped p-type body contact regions or electrodes 38 formed in or otherwise above the p-type well of the body region 36 in the semiconductor substrate 22. The dopant concentration of each contact region 38 may be at a level sufficient to establish an ohmic contact to the body region 36.

The device 20 includes heavily doped source and drain regions 40 and 42 in the semiconductor substrate 22. The source and drain regions 40 and 42 are laterally spaced from one another in the lateral direction shown in the cross-section of FIG. 1. In some embodiments, the source and drain regions 40 and 42 may have additional or alternative lateral spacing. Any number of source or drain regions 40, 42 may be provided. The drain region 42 need not be centered or otherwise disposed between, or laterally surrounded by, the source region 40 as shown. In this example, the source and drain regions 40 and 42 are n-type doped portions of the epitaxial layer 24. The heavily doped n-type source region 40 is disposed within, on, and/or otherwise above the body region 36. The heavily n-type doped drain region 42 is spaced from the body region 36 along the lateral dimension shown in FIG. 1. Such spacing defines a conduction path of the device between the source and drain regions 40, 42. The conduction path may thus be oriented along the lateral dimension shown in FIG. 1. The regions 40, 42, or a portion thereof, may have a dopant concentration at a level sufficient to establish ohmic contacts for biasing the source region 40 and the drain region 42. In a typical LDMOS configuration, the drain region 42 is biased at a high voltage, Vds, relative to the source region 40.

The device 20 includes one or more gate structures 44 formed on or above a surface 46 of the semiconductor substrate 22. In this example, a pair of gate structures 44 are disposed between the source regions 40 and the drain region 42 and arranged in a dual gate finger configuration in which two transistors are symmetrically arranged to share the same drain region 42. For example, the device 20 need not be configured with a dual gate finger configuration. Each gate structure 44 is located on or above a gate dielectric (not shown). For example, the gate dielectric may include silicon dioxide (or oxide) deposited or otherwise formed on the surface 46. Each gate structure 44 includes a conductive gate layer (e.g., a polysilicon plate) on or above the gate dielectric, which insulates the conductive gate layer from the substrate 22. Each gate structure 44 may include one or more dielectric sidewall spacers 48 disposed along lateral edges of the gate structure 44. The sidewall spacers 48 may cover the lateral edges to act as a silicide blocker to prevent a silicide short along the surface 46. The sidewall spacers 48 may provide spacing to separate the conductive components of the gate structure 44 from the source region 40 and other regions of the active region 28. In this example, one of the sidewall spacers 48 is used for alignment purposes in defining an edge of the source region 40.

The configuration of each gate structure 44 may vary. The configuration of each gate structure 44 may include multiple conductive layers (e.g., polysilicon plates). The components, materials, and other characteristics of the gate structures 44 may vary from the example shown.

A number of shallow trench isolation (STI) regions 50 may be formed at the surface 46 in the semiconductor substrate 22. In this embodiment, two of such STI regions 50 space the gate structures 44 from the high voltage applied to the drain region 42. These and other ones of the STI regions 50 may be configured to prevent or minimize hot carrier injection (HCI) into the oxide layer of the gate structure 44.

The device 20 may be configured with one or more lightly or intermediately doped transition regions (e.g., n-type lightly doped drain, or NLDD, regions) at or near the source and drain regions 40 and 42. Each transition region may be or include a diffused region formed in connection with the source region 40 and/or the drain region 42. Such transition regions may assist in controlling the electric field at or near the surface 46, including in areas other than those areas near the source region 40 or the drain region 42.

Other STI regions 50 may be disposed in the semiconductor substrate 22 to isolate or separate various contact regions, such as the body contact region 38 and the source region 40, as well as other regions for biasing components of the device 20. For example, an isolation contact region 52 and a substrate contact region 54 may be separated by one of the STI regions 50.

When the gate structure 44 is biased, charge carriers (in this case, electrons; alternatively, holes) accumulate in one or more channel areas or regions 56. Each channel region 56 (or a portion thereof) may be located in the body region 36 under the gate structure 44. In this example, the accumulation of electrons results in a charge inversion in the channel region 56 from the p-type body region 36 to an n-type conduction layer or area near the surface 46 of the semiconductor substrate 22. Once a sufficient amount of the charge carriers accumulate in the conduction layer or area, charge carriers are capable of flowing from the source region 40 toward the drain region 42 through the channel region 56.

The channel region 56 may include other regions or areas in the semiconductor substrate 22 in which charge inversion or accumulation occurs as a result of the bias applied to the gate structure 44. Charge carriers may also accumulate at the surface 46 of the substrate 22 outside of or beyond the body region 36. For example, charge carriers may accumulate in an area near the surface 46 in a region of the epitaxial layer 24 adjacent the body region 36. This area may, in some cases, be considered to be part of an accumulation region of the device 20. The channel region 56 and the accumulation region may form part of a conduction region or path of the device 20.

The conduction path of the device 20 is not limited to regions in which charge inversion occurs or to regions in which conduction is enabled or enhanced via the bias voltage applied to the gate structure 44. The conduction path or regions of the device 20 are thus not limited to regions at or near the surface 46. For example, the conduction path includes a portion of a drift region 58 of an LDMOS device through which charge carriers drift to reach the drain region 42. The conduction path of the device 20 may thus include areas or regions having a different conductivity type than the body region 36. In this example, the conduction path may thus include an n-type region, such as an n-type drift region 58 (or layer or area thereof). The drift region 58 may electrically couple the drain region 42 and the channel region 56. The drift region 58 may be a field drift region (e.g., in which a field isolation structure is disposed between the accumulation region of the device 20 and the drain region 42). Further details regarding the drift region 58 of the device 20 are set forth below.

The conduction path or regions of the device 20 may include still other regions, whether n-type or p-type, at or near the surface 46. For example, the channel region 56 and/or other conduction region of the device 20 may include one or more intermediately doped n-type transition regions (e.g., one of the NLDD regions described above) in the semiconductor substrate 22.

The path along which the charge carriers flow from the source region 40 to the drain region 42 passes through the drift region 58 in the semiconductor substrate 22. The drift region 58 may be configured to allow the charge carriers to drift under the electric field established by the drain-source voltage applied between the drain region 42 and the source region 40. In this example, the drift region 58 includes an n-type well. The drain region 42 is formed on or otherwise above the drift region 58. A junction forms between the n-type well and the p-type epitaxial layer 24 to establish a RESURF effect directed to decreasing the electric field in areas in and/or around the drift region 58 to increase the intrinsic breakdown voltage (BVdss).

A number of floating RESURF regions 60 are disposed within, inside, or adjacent to the drift region 58. For example, the regions 60 may be surrounded by the drift region 58 and thus incorporated into the drift region 58. The floating regions 60 may further reduce the electric field along or near the STI regions 50 in the drift region 58. Such electric field reduction may, in turn, help avoid HCI effects and/or breakdown in or around the drift region 58. The floating regions 60 are disposed within or otherwise adjacent to the drift region 58. The floating regions 60 are laterally spaced apart from one another. As described below, such lateral spacing may be oriented in a direction orthogonal to the cross-section of FIG. 1. In this example, the floating regions 60 are doped p-type to support further RESURF effects along the conduction path. The floating regions 60 may be disposed under and/or adjacent to one or more field STI regions 62 around which the charge carriers drift during operation. The field STI region(s) 62 space the drain region 42 from the channel region 56. The location of the floating regions 60 may thus define portions of the conduction path within the drift region 58.

As described below in connection with FIGS. 2 and 3, adjacent ones of the floating regions 60 are spaced from one another along a lateral dimension of the device 20 by a respective gap. The lateral dimension may be orthogonal to the lateral dimension of the cross-section of FIG. 1. The floating regions 60 may be discrete or separate from one another, or be connected to one another by, for instance, one or more connecting floating regions. In the example of FIG. 1, each floating region 60 is configured as an island region spaced from one or more adjacent island regions. The islands may be disposed in a discontinuous or non-uniform ring-shaped arrangement around the drain region 42. The separation of adjacent regions 60 may correspond with a respective perforation or gap in the ring-shaped arrangement. Such gaps may allow charge carriers to drift between adjacent regions 60. The discontinuous ring may include a pair of rows of island regions on opposing sides of the drain region 42. The discontinuous ring may also include two end regions linking the two rows of island regions. Such end regions and/or other portions of the ring may not be perforated. In some cases, the floating regions 60 do not include end regions. The arrangement of the floating regions 60 need not be ring-shaped as shown.

In some embodiments, the floating regions 60 are connected. The ring is not perforated in such cases, but nonetheless non-uniform. The floating regions 60 may instead form a composite, floating region having a non-uniform, drain-facing side and a uniform, channel-facing side. The non-uniform side may be configured with a number of teeth or other protrusions projecting toward the drain region. As shown in the example of FIG. 3, the uniform side may be formed by a strip-shaped, floating region that connects the number of spaced apart regions 60.

The floating regions 60 may not have the same depth as the drift region 56. For example, a bottom of each floating region 60 may be shallower than a bottom of the drift region 58. The floating regions 60 may thus be spaced from the p-type doped epitaxial layer 24. The difference in the depths of the drift region 58 and the floating regions 60 may allow the regions 60 to present a mutual RESURF effect in both the lateral and vertical dimensions. The difference in depths may also allow the RESURF regions to remain floating, rather than being tied to, or otherwise affected by, the voltage of the epitaxial layer 24.

The lateral distribution (e.g., separation), arrangement, size, configuration, and other characteristics of the floating regions 60 provide design flexibility for the device 20. For example, the BVdss and Rdson values of the device 20 may be tuned to suit a specific application, as described further below. Overall conduction through the drift region 58 may be addressed across the lateral dimension of the device 20 across which the floating regions 60 are distributed. Adjustments to the floating regions 60 may be made to accommodate application specifications, allowing other characteristics of the device 20, such as the channel width of the device 20, to be configured as desired. The floating regions 60 are compatible with a variety of device designs. For instance, the device 20 may have a double-fingered channel arrangement with a lateral width that may be sized as desired.

The device 20 is shown in simplified form and, thus, FIG. 1 does not show the conductive (e.g., ohmic) contacts and other metal layers configured for electric coupling with the source regions 40, the drain region 42, and the gate structures 44. The device 20 may have a number of other structures or components for connectivity, isolation, passivation, and other purposes not shown in FIG. 1 for ease in illustration. For instance, the device 20 may include any number of additional isolating regions or layers. In some examples, another p-type epitaxial layer (not shown) may be disposed between the original substrate 26 and the active area 28. One or more further STI regions, other isolation trenches, and/or isolation wells (not shown) may be provided to isolate the active area 28 and/or other region of the device 20.

The dopant concentrations, thicknesses, and other characteristics of the above-described semiconductor regions in the semiconductor substrate 22 may vary. In one example of the embodiment shown in FIG. 1, the above-referenced semiconductor regions may have the following approximate concentrations and thicknesses:

|  | Concentration | Thickness |
| --- | --- | --- |
| p-epi 24: | $1 \times 10^{15}/cm^3$ | 5 μm |
| substrate 26: | $1 \times 10^{15}/cm^3$ | not applicable |
| NBL 30 | $5 \times 10^{18}/cm^3$ | 1 μm |

-continued

|  | Concentration | Thickness |
|---|---|---|
| isolation well 32: | $1 \times 10^{17}/cm^3$ | 1.2 µm |
| link region 34: | $1 \times 10^{17}/cm^3$ | 3 µm |
| body 36: | $1 \times 10^{17}/cm^3$ | 0.9 µm |
| source 40: | $1 \times 10^{21}/cm^3$ | 0.25 µm |
| drain 42: | $1 \times 10^{21}/cm^3$ | 0.25 µm |

The concentrations and thicknesses may be different in other embodiments. For example, the dopant concentration of the original substrate 26 may vary considerably.

FIG. 2 is a top view of an exemplary LDMOS device 70 configured in accordance with one embodiment. The top view depicts two lateral dimensions X and Y of the device 70. The first lateral dimension X may correspond with the lateral dimension of the cross-section of FIG. 1. Source regions 72 and a central drain region 74 of the device 70 are spaced from one another along the first lateral dimension X. The conduction path of the device 70 may thus be oriented along the lateral dimension X. The second lateral dimension Y is orthogonal to the first lateral dimension X, and corresponds with the width of the device 70 directed to establishing a desired current density. In this example, the LDMOS device has a double-fingered channel region 76 under a pair of gate structures 78. The channel region 76 is disposed on or above a body region 80 of the device 70. The body region 80 is spaced from the drain region 74 along the first lateral dimension X. The device 70 may be an n-channel device as described above. An n-type drift region 82 is adjacent the body region 80 and surrounds the central drain region 74. In this example, the body region 80 and the drift region 82 are line-on-line, or contiguous. In other embodiments, the drift region 82 may be spaced from, or overlap, the body region 80.

The device 70 includes a discontinuous ring 84 of p-type islands 86 adjacent or within the drift region 82. Adjacent islands 86 are disconnected or spaced apart from one another along the Y dimension by respective gaps 88. The width of the islands 86 along the Y dimension and the size of the gaps 88 may vary. In some examples, the width of the islands 86 falls in a range from about 0.5 µm to about 1.5 µm. In some examples, the gaps 88 space adjacent islands 86 from one another by about 0.5 µm to about 1.5 µm. The discontinuous ring 84 surrounds the central drain region 74. In this example, the discontinuous ring 84 includes a pair of columns (or rows) along opposite sides of the central drain region 74. Each column (or row) includes a number of the islands 86. The islands 86 in one column (or row) may be laterally aligned or offset from the islands 86 in the other column (or row). The islands 86 may be staggered relative to the islands 86 in the opposite column (or row) to a varying extent. The columns (or rows) may have a length such that the discontinuous ring 84 extends along the lateral width of the central drain region 74. During operation, charge carriers drift around the p-type islands 86 (and/or the depletion region formed in the drift region 82 adjacent the islands 86). For example, the charge carriers may drift under the p-type islands 86 (see, e.g., FIG. 1) and/or between adjacent islands 86. The gaps 88 may provide an unobstructed or straight path for charge carriers drifting under the electric field arising from the drain-source bias voltage. In this example, the discontinuous ring 84 also includes a pair of end regions 90 that extend between the two columns (or rows) along the dimension X. The end regions 90 are not perforated by gaps to discourage indirect charge carrier movement in the drift region 82.

The incorporation of the p-type islands 86 into the drift region 82 may allow the BVdss level of the device 70 to be improved through a multi-dimensional RESURF effect with less detriment to the on-state resistance Rdson. The drift region 82 is depleted both laterally and vertically in the area around each island 86. The depletion may extend the entire lateral extent of the drift region 82 in the OFF state of the device, e.g., when the voltage difference between the drain region 74 and the source regions 72 is high. Such widespread depletion may reduce the electric field in and around the drift region 82 to help raise the breakdown voltage level. Notwithstanding such widespread depletion, a lower resistance path may be provided by the discontinuous or non-uniform nature of the ring 84 for charge carriers during the ON state, when the voltage difference is not as high and, thus, the depletion not as extensive. The discontinuities or non-uniformities in the ring 84 thus provide an improvement in specific on-resistance (Rdson) despite the improvement in BVdss arising from the RESURF effect.

The non-uniformity may be adjusted to provide the capability to tune the BVdss and Rdson values to achieve the best compromise for a specific application. For example, the size of each gap 88 may be adjusted to change the resistivity of the drift region 82. An increase in gap size may lead to a decrease in Rdson. Alternatively or additionally, the lateral width of the islands 86 (in the Y dimension) may be adjusted to change the resistivity of the drift region 82 and/or the extent to which the RESURF effect supported by the islands 86 increases BVdss. For instance, wider islands 86 may provide increased voltage blocking capability. The gap spacing and island widths may vary based on the dopant concentrations of the drift region 82 and the islands 86. The resulting BVdss and Rdson values for several exemplary gap spacing and island width values are provided in connection with FIGS. 4-6 for island configurations having an island dopant concentration level of about $4 \times 10^{17}/cm^3$ and a drift region concentration level of about $2 \times 10^{17}/cm^3$. The dopant concentration levels may vary considerably.

The width of each island 86 in the X dimension may alternatively or additionally be selected to tailor the device 70 to a specific application. In the example shown in FIG. 2, each island 86 extends under a respective one of the gate structures 78. Alternatively or additionally, each island 86 may extend beyond the isolation trench (e.g., the STI region) in or adjacent to the drift region 82. In such cases, each island 86 may reach the surface of the semiconductor substrate.

FIG. 3 depicts another exemplary LDMOS device 100 having a similar arrangement of source regions 102, a central drain region 104, and gate structures 106. The drain region 104 is surrounded by a drift region 108, which, in turn, is adjacent a body region 110 of the device 100. As in the above-described embodiment, a number of floating, spaced apart RESURF regions 112 are disposed within, inside or otherwise adjacent the drift region 108. The RESURF regions 112 are separated by respective gaps 114. With the gaps 114, the RESURF regions 112 provide a non-uniform interface in the drift region 108.

The embodiment of FIG. 3 differs from the above-described example in that adjacent RESURF regions 112 are connected by an additional floating RESURF region 116 that extends along the lateral extent of the RESURF regions 112. The region 116 may be shaped as a band or belt around the regions 112. The region 116 may appear as a stripe when viewed from above as in FIG. 3. The RESURF regions 112 are configured as protrusions projecting from the region 116 toward the drain region 104. Like the RESURF regions 112, the additional RESURF region 116 is disposed in the semiconductor substrate within, inside, or otherwise adjacent the drift region 108, is electrically floating, and is similarly doped (e.g., p-type). The additional RESURF region 116 is configured to surround and connect the plurality of floating RESURF regions to form a non-perforated RESURF ring around the drain region 104. In this example, the RESURF ring is comb-shaped. The RESURF regions 112 may form teeth or tines projecting toward the drain region 104. The shape of the teeth, tines, or other protrusions may vary. The side facing the drain region 104 may be crenellated, scalloped, or otherwise non-uniform. During operation, the charge carriers drifting through the drift region 108 move around (e.g., under) the composite RESURF structure and, in some cases, through the gaps between the teeth, tines, or other projections presented by the RESURF regions 112. The regions 112 and 116 may be formed simultaneously (e.g., during the same implantation procedure). The region 116 may thus be contiguous with each region 112.

The RESURF ring in the embodiment of FIG. 3 presents a non-uniform interface to the charge carriers. The interface is non-uniform despite the non-perforated nature of the ring. In this example, the interface has a non-uniform, drain-facing side 118 and a continuous (or uniform), channel-facing side 120. The drain-facing side 118 is non-uniform because of notches formed by the gaps 114 between the regions 112. The channel-facing side 120 is uniform because of the band-shaped nature of the region 116 and corresponding lack of notches. The notches and lack of notches may form the comb-shaped arrangement of the RESURF ring.

The notched, drain-facing side 118 of the RESURF ring sees the higher potential of the drain region 104 during operation. Depletion along the drain-facing side 118 may thus be more extensive despite the n-type regions in the gaps 114. The lack of notches on the uniform, channel-facing side 120 may provide more effective blocking of the drain-source voltage during the OFF state. When the drain-source voltage is lower in the ON state, the notches in the drain-facing side present additional n-type area through which the charge carriers may pass. The size of the notches or gaps 114 and/or the width of the regions 112 may thus be adjusted to tailor the BVdss and Rdson levels of the device 100.

The on-resistance and breakdown voltage levels may be adjusted via customization of the spaced apart, floating RESURF regions 112 and/or the additional floating RESURF region 116. One or more characteristics of the RESURF regions may be customized to achieve or maintain a desired on-resistance value, as described above in connection with the embodiment of FIG. 2. For example, the customization may involve the lateral spacing (e.g., the size of the gaps 114) and/or width of the floating RESURF regions 112. The dopant concentration of the RESURF regions 112, 116 may also be adjusted. Customization of the vertical dimension (e.g., depth) of the floating RESURF regions 112, 116 may also allow the on-resistance to be customized. The RESURF regions 112, 116 may have depth that does not reach through the entire depth of the drift region 108. The depth of the RESURF regions 112, 116 may also be adjusted to attain a desired balance between the BVdss and Rdson levels. Other characteristics that may be adjusted include the shape of the regions 112, the degree to which the channel-facing side 120 is uniform (and the shape and/or size of any discontinuities therein), the lateral extent of either the regions 112 or the region 116 (e.g., whether the regions 112, 116 extend beyond the STI region), and/or whether the regions 112, 116 reach the surface of the semiconductor substrate. The number of comb-shaped or other floating RESURF structures or regions (e.g., rings, rows, or columns) may also or alternatively be adjusted.

For example, multiple columns or rows of floating regions may be disposed on each side of the drain region within or otherwise adjacent the drift regions, with the columns or rows on each side of the drain region being spaced apart from one another in the lateral direction of the conduction path (see, e.g., the direction X in FIG. 2). The gaps, notches or other non-uniformities in adjacent columns or rows may be aligned or staggered. The spacing of such adjacent columns or rows may be oriented along other dimensions or directions, such as a vertical direction. Through such arrangements, the electric field may be shaped and controlled to sustain a higher BVDSS level while still allowing sufficient un-depleted drift region space or area for the on-current to flow with minimal impediment between the channel and drain regions.

The non-uniform, comb-shaped ring arrangement may provide a cost-effective improvement in the overall electrical performance of LDMOS and other devices, while obtaining the best balance between the BVdss and Rdson levels to suit specific applications. LDMOS devices with comb-shaped arrangements may achieve lower Rdson levels relative to devices having a continuous floating stripe with minimal detriment in breakdown voltage, if any. In one example comparing devices with comb- and stripe-shaped floating regions, the BVDSS/Rdson ratio improved by 17% while the substrate current/drain current ratio simultaneously decreased by 29%. The comb-shaped arrangement may thus allow LDMOS and other devices to be optimized for better BVdss and Rdson levels, while also reducing hot carrier generation.

Figure 5:
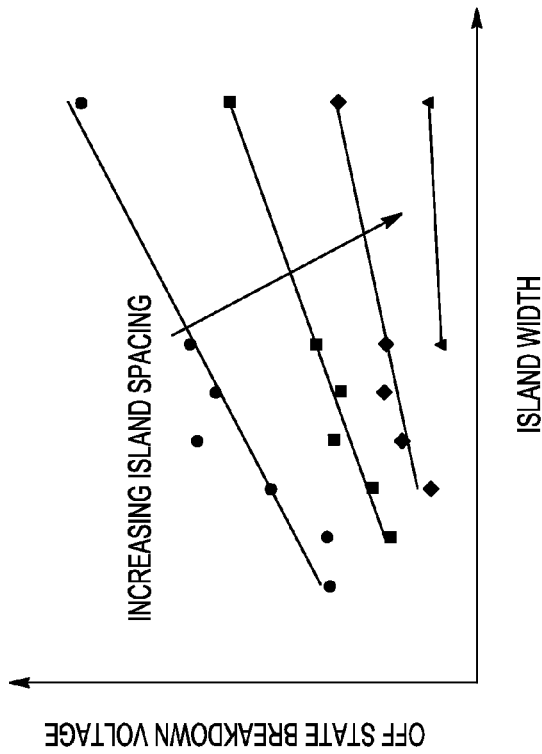
FIG. 5 is a graphical plot of off-state breakdown voltage level (BVdss) as a function of RESURF island width for a number of exemplary LDMOS transistors having respective spacing between the RESURF islands.
Figure 4:
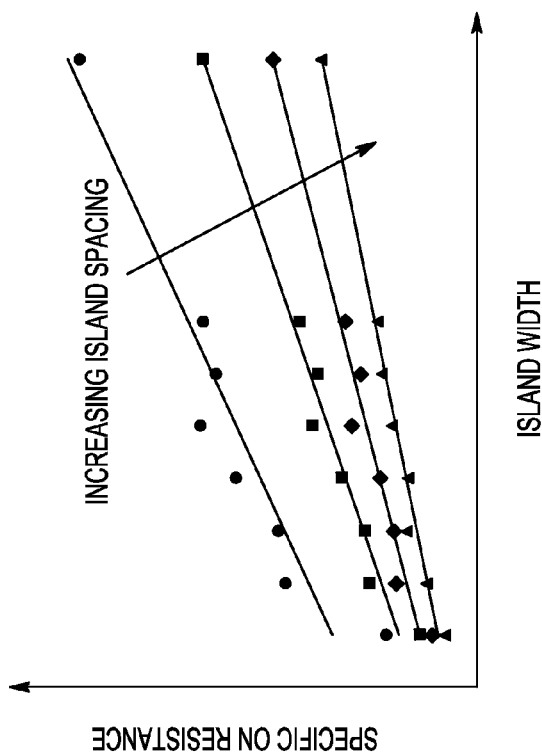
FIG. 4 is a graphical plot of drain-source resistance as a function of RESURF island width for a number of exemplary LDMOS transistors having respective spacing between the RESURF islands.

FIG. 4 depicts how the specific on-resistance, or Rdson, of LDMOS devices varies as a function of the width of the islands, and may be further customized by adjusting the spacing between the islands. Rdson levels are plotted for four different island spacing values over a range of island widths. The Rdson levels generally fall as the spacing between the islands increases, and rise with increasing island width. The effects of these same parameters on the BDdss level are shown in FIG. 5. The BVdss level rises as a function of island width, and is generally lower with increasing island spacing. Optimal Rdson and BVdss levels may be attained through selection of these two parameters.

Figure 6:
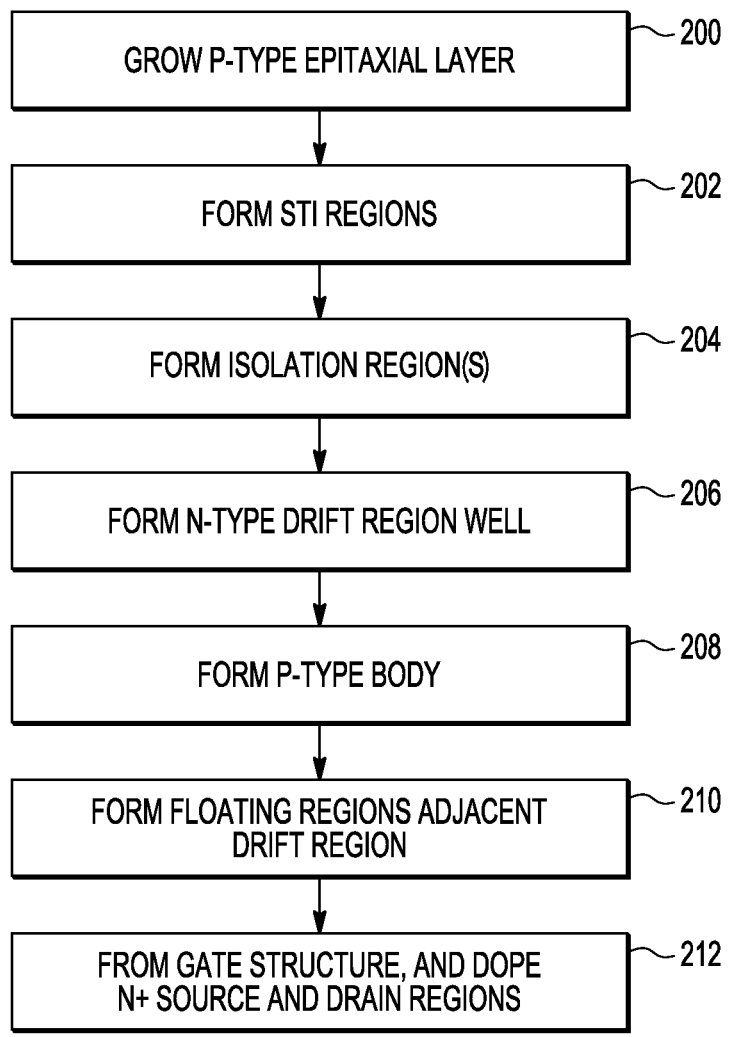
FIG. 6 is flow diagram of an exemplary fabrication sequence to construct a field drift LDMOS transistor having a plurality of spaced apart, floating RESURF regions in accordance with one embodiment.

FIG. 6 shows an exemplary fabrication method 199 for fabricating a device with a drift region having a drift region configured as described above. The method may be directed to fabricating a reduced surface field (RESURF) transistor having either an island or comb-shaped RESURF arrangement as described above. The transistor is fabricated with a semiconductor substrate, the regions or layers of which may have the conductivity types of the n-channel examples described above, or be alternatively configured to support a p-channel device. The method includes a sequence of acts or steps, only the salient of which are depicted for convenience in illustration. The ordering of the acts may vary in other embodiments. The fabrication method is not limited to any particular doping mechanism, and may include future developed doping techniques.

The method 199 may begin with, or include, a step 200 in which a p-type epitaxial layer (p-epi) is grown on a p-type semiconductor substrate. In some cases, the step 200 includes the formation via, e.g., ion implantation, of one or more barrier layers in the epitaxial layer. The barrier layer may be configured via a mask to extend across an active area of the RESURF transistor. In some cases, the step 200 includes the growth of another p-type epitaxial layer. Any number of epitaxial layers may be grown.

In this embodiment, STI regions are formed in a step 202 in the substrate. Some of the STI regions are located in an area in which a drift region is formed. The STI regions may be formed via any now known or hereafter developed procedure. For example, the step 202 may include the formation of a trench and the deposition (e.g., chemical vapor deposition, or CVD) of one or more materials in the trench. In some embodiments, the trench is filled with silicon oxide. Additional or alternative materials may be deposited. In an alternative embodiment, the STI region is formed after the drift region is formed.

One or more doped isolating regions may be formed in a step 204. The doped isolating regions may define an active area of the device by, e.g., surrounding or encasing the lateral area. One or more of the doped isolating regions may isolate the device laterally by defining the lateral boundaries of the active area. One or more other isolation regions may isolate the device vertically by defining a depth of the device in the substrate. Any number of the isolation regions may be formed in the epitaxial layer and/or the original substrate.

In a step 206, the substrate is doped to form the drift region of the device. The doping procedure may include an n-type dopant implantation. In a step 208, a p-type well is formed by doping a body region of the substrate. In some embodiments, the step 208 includes an implantation procedure. The body region may be spaced from or adjacent to the drift region as described above. A heavily doped p-type contact region for the body region may be formed in the p-type well via a separate ion implantation procedure.

In a step 210, a number of floating p-type regions are formed within or otherwise adjacent to the drift region. In some cases, the p-type regions may be disposed under and adjacent to a respective one of the STI regions disposed in the drift region. Alternatively or additionally, the p-type regions may extend laterally beyond the STI regions and, in some embodiments, reach the surface of the substrate. Each region may be configured to support a RESURF effect in the drift region. The p-type regions may be formed via an implantation procedure used to form one or more other p-type regions of the device (and/or another device fabricated on the same substrate). The regions may be disposed in a ring-shaped arrangement around the location in which a drain region is formed. Adjacent regions are spaced from one another along a second lateral dimension of the transistor by a respective gap. The p-type regions may be arranged as a ring of floating, disconnected islands (e.g., with end regions between opposing rows of the islands), or include a continuous band or belt that connects the other regions to form a comb-shaped arrangement, as described above. The p-type regions may be disposed to establish a perforated or notched drain-side interface around which the charge carriers drift during operation.

The fabrication process may then include one or more procedures collectively shown in a step 212. The procedures may be implemented in various orders. Additional or alternative procedures may be implemented. A gate structure may initially be formed. Source and drain regions may then be formed, using the gate structure for self-alignment of the source region. The source and drain regions are spaced apart from one another along a first lateral dimension of the transistor, as described above. One or more n-type ion implantation procedures may be performed. For example, formation of one or both of the source region and the drain region may include a moderate implant before formation of sidewall spacers of the gate structure to create one or more transition regions (see, e.g., FIG. 1). A heavy implant after formation of the sidewall spacers may then be implemented to form the source and/or drain regions adjacent to such transition regions.

Additional acts may be implemented at various points during the fabrication procedure. For example, one or more acts may be directed to defining an active area of the device. In some cases, such acts may include the formation of one or more device isolating wells, layers, or other regions. One or more metal layers may be deposited. Any number of additional STI regions may be formed.

The disclosed devices may include a comb-shaped or otherwise non-continuous floating p-type region within the drift region to attain tunable BVdss and Rdson without modifying existing process or adding new process steps. Multi-dimensional RESURF within the drift region may be attained.

In a first aspect, a device includes a semiconductor substrate, a body region in the semiconductor substrate and having a first conductivity type, and including a channel region through which charge carriers flow during operation, a drain region in the semiconductor substrate, having a second conductivity type, and spaced from the body region along a first lateral dimension of the semiconductor substrate, a drift region in the semiconductor substrate, having the second conductivity type, and electrically coupling the drain region to the channel region, and a plurality of floating reduced surface field (RESURF) regions in the semiconductor substrate adjacent the drift region, having the first conductivity type, and around which the charge carriers drift through the drift region under an electric field arising from a voltage applied to the drain region during operation. Adjacent floating RESURF regions of the plurality of floating RESURF regions are spaced from one another along a second lateral dimension of the device by a respective gap.

In a second aspect, an electronic apparatus includes a substrate and a transistor disposed in the substrate. The transistor includes a first semiconductor region having a first conductivity type, second and third semiconductor regions having a second conductivity type, disposed above the first semiconductor region, spaced from one another along a first lateral dimension of the transistor, and between which a voltage is applied during operation, a fourth semiconductor region having the second conductivity type and in which charge carriers drift between the second and third semiconductor regions under the applied voltage, and a plurality of floating semiconductor regions adjacent the fourth semiconductor region, having the first conductivity type, and around which the charge carriers move while drifting through the fourth semiconductor region. Adjacent floating semiconductor regions of the plurality of floating semiconductor regions are spaced from one another along a second lateral dimension of the transistor by a respective gap.

In a third aspect, a method of fabricating a transistor includes forming a drift region of the transistor in a substrate, the drift region having a first conductivity type, forming source and drain regions in the substrate, having the first conductivity type, and being spaced apart from one another along a first lateral dimension of the transistor, and doping the substrate to form a plurality of floating reduced surface field (RESURF) regions adjacent the drift region, having a second conductivity type, and around which charge carriers drift through the drift region during operation. Adjacent floating RESURF regions of the plurality of floating RESURF regions are spaced from one another along a second lateral dimension of the transistor by a respective gap.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A device comprising:
a semiconductor substrate;
a body region in the semiconductor substrate and having a first conductivity type, and comprising a channel region through which charge carriers flow during operation;
a drain region in the semiconductor substrate, having a second conductivity type, and spaced from the body region along a first lateral dimension of the semiconductor substrate;
a drift region in the semiconductor substrate, having the second conductivity type, and electrically coupling the drain region to the channel region;
a plurality of floating reduced surface field (RESURF) regions in the semiconductor substrate adjacent the drift region, having the first conductivity type, and around which the charge carriers drift through the drift region under an electric field arising from a voltage applied to the drain region during operation; and
a further floating RESURF region in the semiconductor substrate adjacent the drift region, having the first conductivit type, and around which the charge carriers move while drifting through the drift region, wherein the further floating RESURF region connects the plurality of floating RESURF regions to form a non-perforated, notched ring around the drain region;
wherein adjacent floating RESURF regions of the plurality of floating RESURF regions are spaced from one another along a second lateral dimension of the device by a respective gap; and
wherein the plurality of floating RESURF regions are disposed between the further floating RESURF region and the drain region to form a notched drain-side face.

2. The device of claim 1, wherein the RESURF regions of the plurality of RESURF regions are disposed in a ring-shaped arrangement around the drain region.

3. The device of claim 1, wherein the further floating RESURF region and the plurality of RESURF regions are connected in a comb-shaped arrangement.

4. The device of claim 1, wherein the plurality of floating RESURF regions are disposed under and adjacent to at least one shallow trench isolation (STI) region that spaces the drain region from the channel region.

5. The device of claim 1, wherein the plurality of floating RESURF regions comprise a pair of non-perforated end regions that extend an entire width of the drain region along the first lateral dimension.

6. The device of claim 1, wherein the plurality of floating RESURF regions are configured as protrusions projecting from the further floating RESURF region toward the drain region.

7. An electronic apparatus comprising:
a substrate; and
a transistor disposed in the substrate, the transistor comprising:
a first semiconductor region having a first conductivity type;
second and third semiconductor regions having a second conductivity type, disposed above the first semiconductor region, spaced from one another along a first lateral dimension of the transistor, and between which a voltage is applied during operation;
a fourth semiconductor region having the second conductivity type and in which charge carriers drift between the second and third semiconductor regions under the applied voltage; and
a plurality of floating semiconductor regions adjacent the fourth semiconductor region, having the first conductivity type, and around which the charge carriers move while drifting through the fourth semiconductor region;
wherein adjacent floating semiconductor regions of the plurality of floating semiconductor regions are spaced from one another along a second lateral dimension of the transistor by a respective gap,
wherein the plurality of floating semiconductor regions comprise a pair of non-perforated end regions that extend an entire width of the third semiconductor region along the first lateral dimension, and
wherein the transistor further comprises a further floating semiconductor region adjacent the fourth semiconductor region having the first conductivity type and around which the charge carriers move while drifting through the fourth semiconductor region, wherein the further floating semiconductor region surrounds and connects the plurality of floating semiconductor regions to form a non-perforated notched ring around the third semiconductor region;
wherein the plurality of floating semiconductor regions are disposed between the further floating semiconductor region and the third semiconductor region to form a notched side facing the third semiconductor region.

8. The electronic apparatus of claim 7, wherein the plurality of floating semiconductor regions are disposed in a ring-shaped arrangement around the third semiconductor region.

9. The device of claim 7, wherein the plurality of floating semiconductor regions are configured as protrusions projecting from the further floating semiconductor region toward the third semiconductor region.

10. A method of fabricating a transistor, the method comprising:
forming a drift region of the transistor in a substrate, the drift region having a first conductivity type;
forming source and drain regions in the substrate, having the first conductivity type, and being spaced apart from one another along a first lateral dimension of the transistor; and
doping the substrate to form a plurality of floating reduced surface field (RESURF) regions adjacent the drift region, having a second conductivity type, and around which charge carriers drift through the drift region during operation;

wherein adjacent floating RESURF regions of the plurality of floating RESURF regions are spaced from one another along a second lateral dimension of the transistor by a respective gap, and wherein doping the substrate comprises forming a further floating RESURF region in the substrate adjacent the drift region having the second conductivity type and around which the charge carriers move while drifting through the drift region, wherein the further floating RESURF region comprises a continuous ring that connects the plurality of floating RESURF regions;

wherein the plurality of floating RESURF regions are disposed between the further floating RESURF region and the drain region to form a notched drain-side face.

11. The method of claim 10, wherein the plurality of RESURF regions are disposed in a ring-shaped arrangement around the drain region.

12. The method of claim 10, wherein the plurality of floating RESURF regions comprise a pair of rows of island regions arranged along opposite sides of the drain region.

13. The method of claim 10, wherein the further floating RESURF region and the plurality of RESURF regions are connected in a comb-shaped arrangement.

14. The method of claim 10, wherein the plurality of floating RESURF regions are configured as protrusions projecting from the further floating RESURF region toward the drain region.

* * * * *

UNITED STATES PATENT AND TRADEMARK OFFICE
CERTIFICATE OF CORRECTION

Page 1 of 1

PATENT NO.        : 9,024,380 B2
APPLICATION NO.   : 13/529589
DATED             : May 5, 2015
INVENTOR(S)       : Weize Chen et al.

It is certified that error appears in the above-identified patent and that said Letters Patent is hereby corrected as shown below:

In the Claims:

Column 16, line 37:
add a "," after the word "region" and add a "," after the word "type".

Column 17, line 7:
add a "," after the word "region" and add a "," after the word "type".

Signed and Sealed this
Sixth Day of October, 2015

Michelle K. Lee
*Director of the United States Patent and Trademark Office*